United States Patent
Devender et al.

(10) Patent No.: US 10,109,706 B1
(45) Date of Patent: Oct. 23, 2018

(54) METHOD OF FORMING HIGH PERFORMANCE VERTICAL NATURAL CAPACITOR (VNCAP)

(71) Applicant: GLOBALFOUNDRIES INC., Grand Cayman (KY)

(72) Inventors: Devender, Pflugerville, TX (US); Sunil K. Singh, Mechanicville, NY (US); M. Golam Faruk, Clifton Park, NY (US); Dewei Xu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/643,721

(22) Filed: Jul. 7, 2017

(51) Int. Cl.
| | |
|---|---|
| *H01L 21/31* | (2006.01) |
| *H01L 49/02* | (2006.01) |
| *H01L 21/311* | (2006.01) |
| *H01L 21/027* | (2006.01) |
| *H01L 21/283* | (2006.01) |
| *H01L 21/3105* | (2006.01) |
| *H01L 27/12* | (2006.01) |

(52) U.S. Cl.
CPC .......... *H01L 28/90* (2013.01); *H01L 21/0273* (2013.01); *H01L 21/283* (2013.01); *H01L 21/31051* (2013.01); *H01L 21/31144* (2013.01); *H01L 28/75* (2013.01); *H01L 27/1203* (2013.01)

(58) Field of Classification Search
CPC .............. H01L 21/31; H01L 21/31051; H01L 21/31144; H01L 21/283; H01L 21/0273
See application file for complete search history.

(56) References Cited

U.S. PATENT DOCUMENTS

| | | | |
|---|---|---|---|
| 7,816,197 B2 | 10/2010 | Kim et al. | |
| 8,856,715 B1 | 10/2014 | Stephens et al. | |
| 9,870,993 B1* | 1/2018 | Edelstein | .......... H01L 23/53223 |
| 9,875,947 B2* | 1/2018 | Russell | .................. H01L 22/20 |
| 2013/0164901 A1* | 6/2013 | Richter | ................... H01L 28/90 |
| | | | 438/381 |
| 2014/0252625 A1* | 9/2014 | Ting | ................. H01L 21/76883 |
| | | | 257/751 |

* cited by examiner

*Primary Examiner* — Phuc Dang
(74) *Attorney, Agent, or Firm* — Anthony Canale; Hoffman Warnick LLC

(57) ABSTRACT

The present disclosure describes a method or forming vertical natural capacitor (VNCAP) and the resulting device. The method includes applying a patterned mask over an insulation layer. The method includes forming using the patterned mask, a dielectric trench in the insulation layer. The method includes depositing a high dielectric constant k (high k) layer in the dielectric trench. The method includes forming a first trench and a second trench in the high k dielectric layer. The high k dielectric layer is disposed between the first trench and the second trench. The method includes depositing metal in the first trench and the second trench.

15 Claims, 13 Drawing Sheets

US 10,109,706 B1

METHOD OF FORMING HIGH PERFORMANCE VERTICAL NATURAL CAPACITOR (VNCAP)

FIELD OF THE INVENTION

The present application relates to a semiconductor structure more particularly to a method for formation of a vertical natural capacitor (VNCAP).

BACKGROUND

The capacitor is a critical element in radiofrequency and microwave circuits for high frequency wireless applications.

A metal-insulator-metal (MIM) capacitor is commonly used in high performance applications in CMOS technology. Typically, the MIM capacitor has a sandwich structure and can be described as a parallel plate capacitor. The capacitor top metal (CTM) is separated from the capacitor bottom metal (CBM) by a thin insulating dielectric layer. Both parallel plates are typically formed from Al or AlCu alloys that can be patterned and etched through the use of several photolithography/photomasking steps. The thin insulating dielectric layer is typically made from silicon oxide or silicon nitride deposited by chemical vapor deposition (CVD). However, MIM capacitors are costly to manufacture and show decreased performance in advanced nodes, such as 7 nanometer (nm) and 10 nm nodes.

Each integrated circuit (IC) of a particular device can be made up of billions of interconnected devices, such as transistors, resistors, capacitors, and diodes, located on one or more chips of semiconductor substrate material. The quality and viability of a product including an IC therein can be at least partially dependent on the techniques used for fabricating the IC and the structure of various components therein. Fabrication of an IC can include two phases: front-end-of-line processes (FEOL) and back-end-of-line processes (BEOL). FEOL generally includes fabrication processes performed on a wafer up to and including the formation of a first "metal layer," i.e., a metal wire for connecting several semiconductor devices together. BEOL generally includes fabrication processes following the formation of the first metal layer, including the formation of all subsequent metal layers.

Vertical natural capacitors (VNCAP) with stacked via-comb structures have emerged as an attractive option due to their low cost, high density, and highly symmetric configurations. However, VNCAP production methods are not compatible with advanced nodes.

A method for fabricating an IC structure including a vertical natural capacitor (VNCAP) includes applying a patterned mask over an IC structure wherein the IC structure having a dielectric layer during BEOL fabrication processes. The patterned mask is used to form a trench between a first metal formation and a second metal formation in the dielectric layer. The first metal formation and second metal formations are spaced apart from each other. A dielectric material is deposited in the trench so that the first metal formation and the second metal formation define a VNCAP. The process described in this publication requires patterning after metallization of the IC structure and deposition of a dielectric material in trenches.

BRIEF SUMMARY

An embodiment of the present disclosure provides a method including applying a patterned mask over an insulation layer. The method includes forming using the patterned mask, a dielectric trench in the insulation layer. The method includes depositing a high dielectric constant k (high k) layer in the dielectric trench. The method includes forming a first trench and a second trench in the high k layer. The high k layer is disposed between the first trench and the second trench. The method includes depositing metal in the first trench and the second trench, wherein the metal in the first trench and the metal in the second trench define a capacitor.

Another embodiment of the present disclosure provides an integrated circuit (IC) structure. The IC structure includes a dielectric layer. The IC structure includes a first metal formation disposed within the dielectric layer; and a second metal formation disposed within the dielectric layer. The first metal formation and the second metal formation define a capacitor, wherein a capacitor density in the semiconductor structure is at least 9.5 femtofarads per square micrometer ($fF/m^2$).

Yet another embodiment of the present disclosure provides a method including applying a patterned mask an insulation layer. The method includes forming one or more first metal trenches in the insulation layer using the first patterned mask. The method includes depositing a high dielectric constant (high k) dielectric liner layer in the one or more first metal trenches. The method includes applying a second patterned mask over the insulation layer and forming one or more second metal trenches in the insulation layer, wherein the insulation layer is between the one or more first metal trenches and the second metal trench. The method includes depositing metal in the one or more first metal trenches and the one or more second metal trenches. The metal in the one or more first metal trenches and the one or more second metal trenches define a vertical natural capacitor (VNCAP).

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The disclosure will now be described by reference to the accompanying figures. In the figures, various aspects of the structures have been shown and schematically represented in a simplified manner to more clearly describe and illustrate the disclosure. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the disclosure is not limited to constructions of any particular shape.

Described herein is a process for creating a high capacitance density in an IC structure. The process provides improved VNCAP performance and eliminates or reduces the need for MIM capacitor processing.

Figure 1:
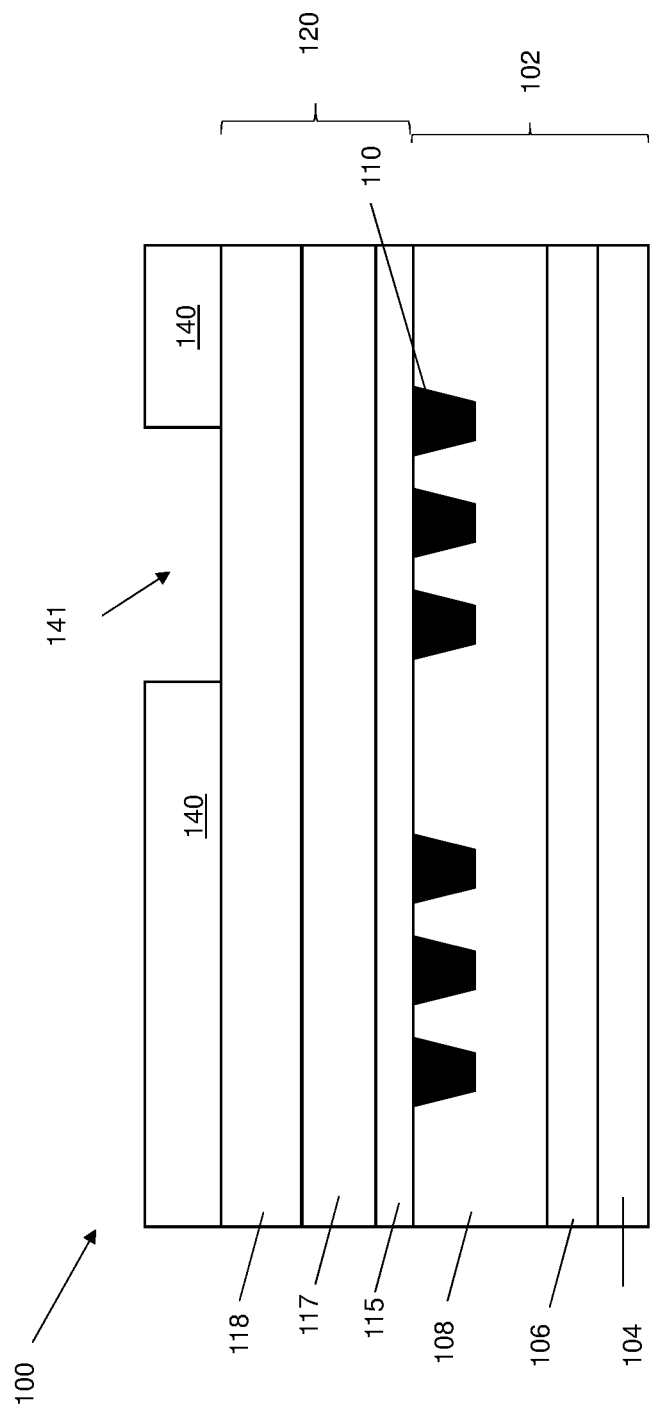
FIG. 1 illustrates a cross-sectional view of an IC structure in an intermediate stage of fabrication after application of a mask.

Referring to FIG. 1, embodiments of an example initial IC structure 100 for forming a VNCAP, according to the disclosure, is shown. IC Structure 100 may include semiconductor-on-insulator (SOI) substrate 102 which may include base substrate 104, insulator layer 106 and semiconductor-on-insulator (SOI) layer 108 therein. FIG. 1 shows metal formations 110. In FIG. 1, metal formations 110 may be the first metal layer M1. Subsequent layers having metal formations above M1 may be referred to as M2, M3 etc. Any metal layer may be processed according to the disclosure. The IC structure 100 may have a lowest layer (not shown) that may contain devices such as transistors, resistors, inductors, diodes, et al. A contact layer may be superimposed directly on the lowest layer. Contact layer (not shown) may provide contact points, which may include contact points to one or more metal interconnection layers) for further interconnection/connectivity. Above the contact layer, there may be superimposed a series of alternating metallization and via layers. The metal layers may provide horizontal connectivity among or between components of lower layers, while the via layers (not shown) may provide vertical connectivity between or among interconnections of various metal layers.

Base substrate 104, SOI layer 108 may include but are not limited to silicon, germanium, silicon germanium, silicon carbide, and those consisting essentially of one or more III-V compound semiconductors having a composition defined by the formula $Al_{X0}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of each layer may be strained. For example, SOI layer 108 (and/or epi layer thereover) may be strained.

Insulator layer 106 may include any now known or later developed dielectric used for SOI layers, such as but not limited to silicon dioxide or sapphire. As noted, the choice of insulator depends largely on intended, application, with sapphire being used for radiation-sensitive applications and silicon oxide preferred for improved performance and diminished short channel effects in microelectronics devices. The precise thickness of insulator layer 106 and SOI layer 108 also vary widely with the intended application. Referring still to FIG. 1, IC structure 100 includes insulation layer 120 which may further include one or more individual sublayers. In an embodiment, insulation layer 120 includes nitrogen-doped silicon carbide layer 115 such as NBLoK® (NBLoK® is available from Applied Materials, Inc.), silicon dioxide sublayer 117 and silicon nitride sublayer 118. Sublayer 117 and sublayer 118 may be the same material or a similar material. Silicon nitride may be substituted for NBLoK sublayer 115 as an alternative. Other materials can be used for insulation layer 120. In another embodiment, there may be an additional nitride sublayer (not shown) between sublayer 115 and sublayer 117. Insulation layer 120 may include any dielectric material or materials that would serve as an electrically insulating layer. For purposes of illustration and not limitation, such a dielectric material may include but are not limited to: silicon nitride ($Si_3N_4$), silicon oxide ($SiO_2$), fluorinated $SiO_2$ (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. The dielectric constant for insulation layer 112 is between 2.55 and 3.8.

FIG. 1 illustrates IC structure 100 after application of a mask layer 140 which can be over insulation layer 120. Mask layer 140 can include a photoresist mask, such as an extreme ultraviolet (EUV) mask. Mask layer is patterned to include an opening 141.

Figure 2:
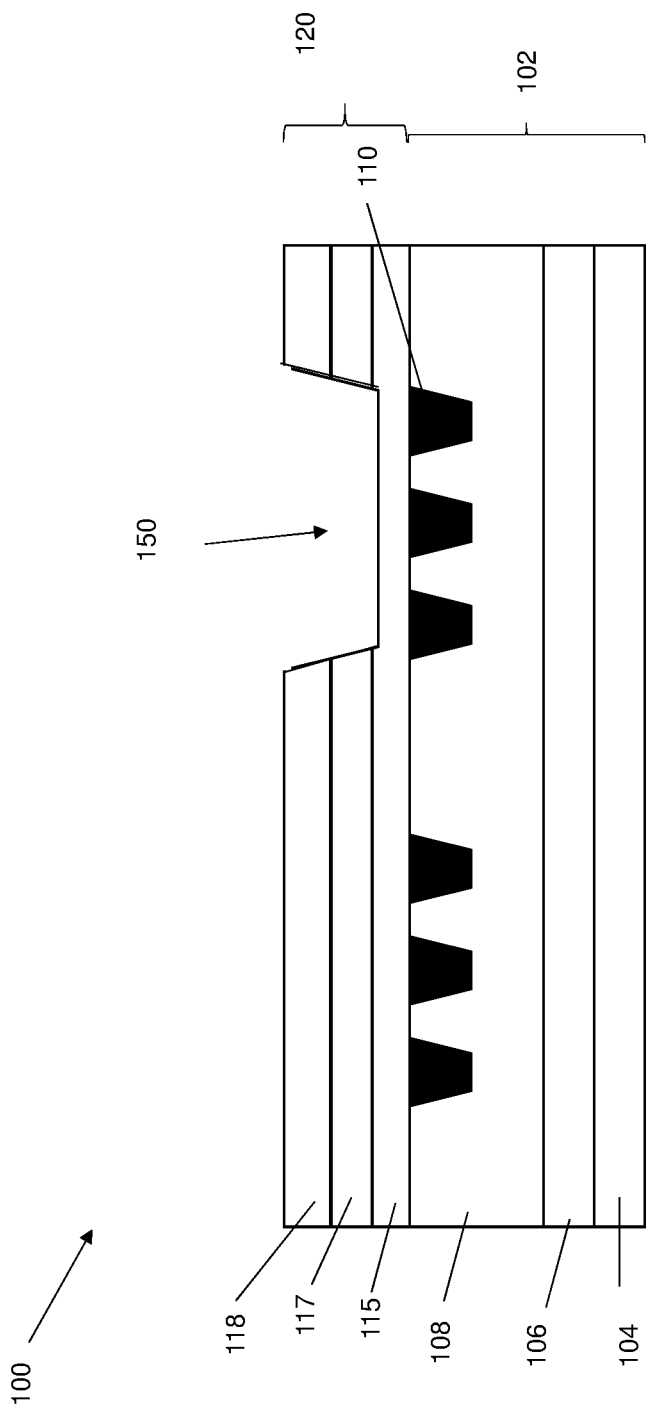
FIG. 2 illustrates a cross-sectional view of an IC structure in an intermediate stage of fabrication after formation of a dielectric trench.

FIG. 2 illustrates IC structure 100 as shown in FIG. 1 after formation of dielectric trench 150 in insulation layer 120. An etching process can be used for the formation of dielectric trench 150 using mask 140.

Dielectric trench 150 may be formed through lithographically patterning and etching. In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example, etching generally refers to the removal of material from a substrate (or structures formed on the substrate), and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic.

Figure 3:
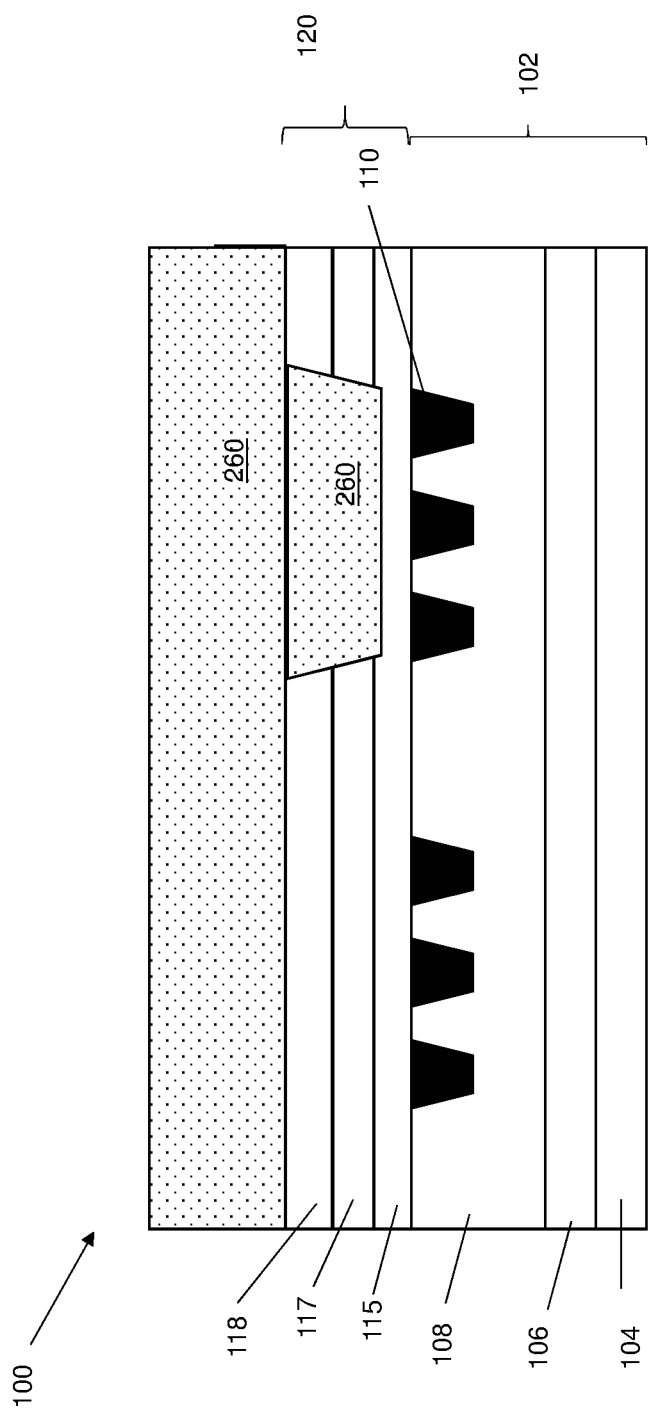
FIG. 3 illustrates a cross-sectional view of an IC structure in an intermediate stage of fabrication after formation of a dielectric layer in the dielectric trench.

FIG. 3 illustrates IC structure 100 as shown in FIG. 2 after deposition of layer 260 in dielectric trench 150 and over insulation layer 120. Layer 260 includes a high dielectric constant (high k) material such as, metal oxides including tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). The high k material has dielectric constant of between 15 and 7000, or in embodiments from 2000 to 7000.

Where materials are deposited, "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 4:
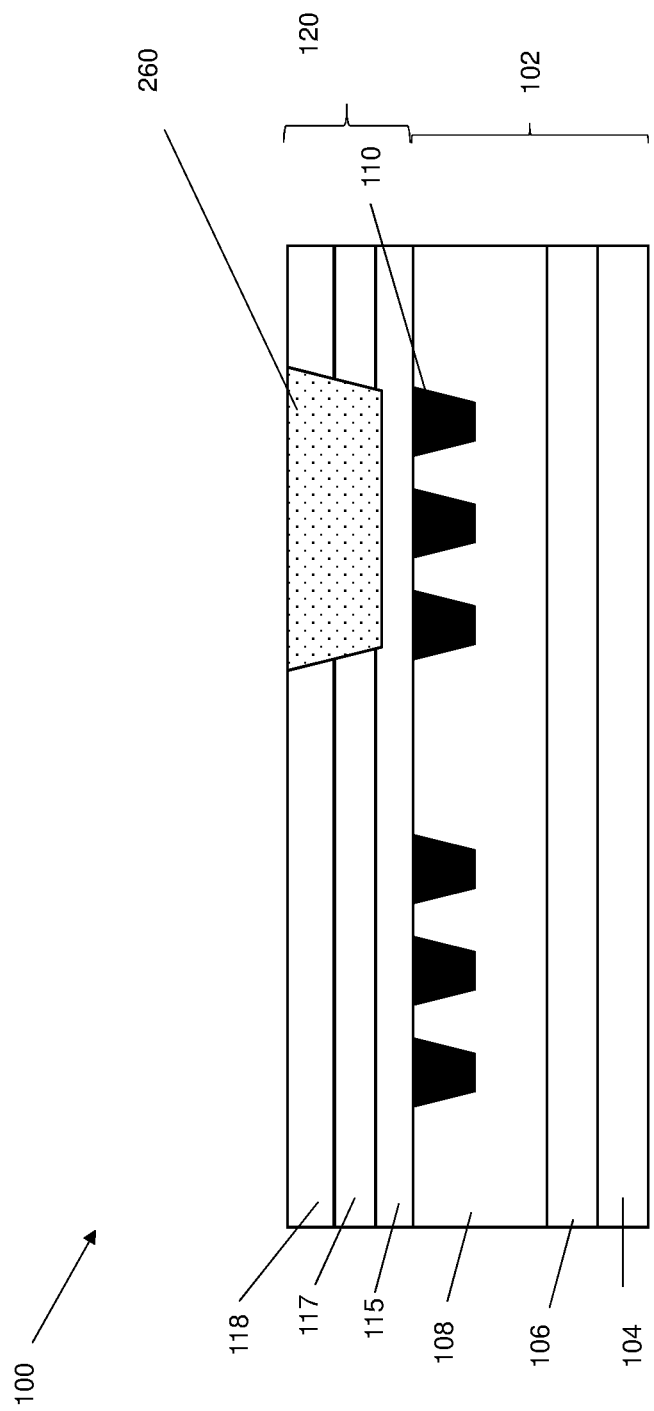
FIG. 4 illustrates a cross-sectional view of an IC structure in an intermediate stage of fabrication after planarization of the IC structure.

FIG. 4 illustrates IC structure 100 after planarization of layer 260 in FIG. 3. On completion of planarization according to the depiction in FIG. 4, insulation layer 120 and layer 260 can have a common top elevation. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back. In an embodiment, chemical mechanical planarization (CMP) can be used for planarization as is depicted in FIG. 4.

Figure 5:
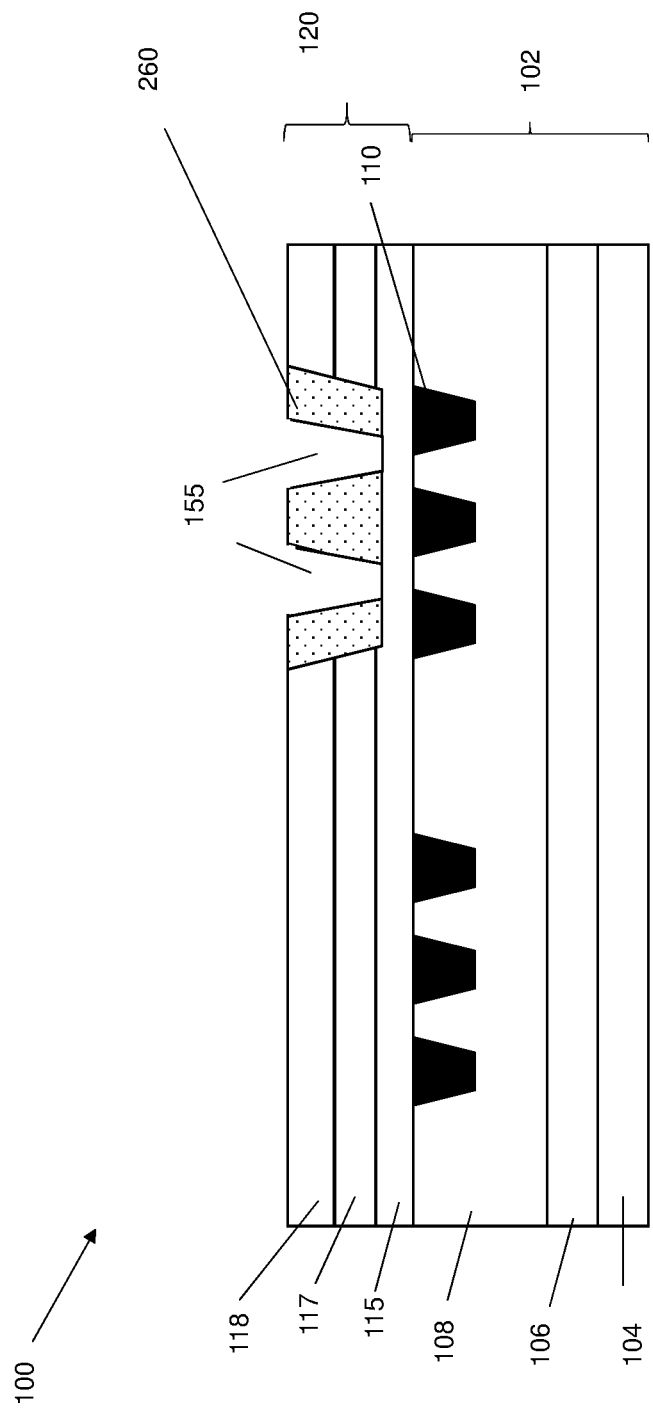
FIG. 5 illustrates a cross-sectional view of an IC structure in an intermediate stage of fabrication after formation of trenches in a dielectric layer.

FIG. 5 illustrates IC structure 100 after formation of first and second trenches 155 in high k dielectric layer 260. The formation of first and second trenches 155 can be through wet etch or dry etch as described above after application mask layer (not shown).

Figure 6:
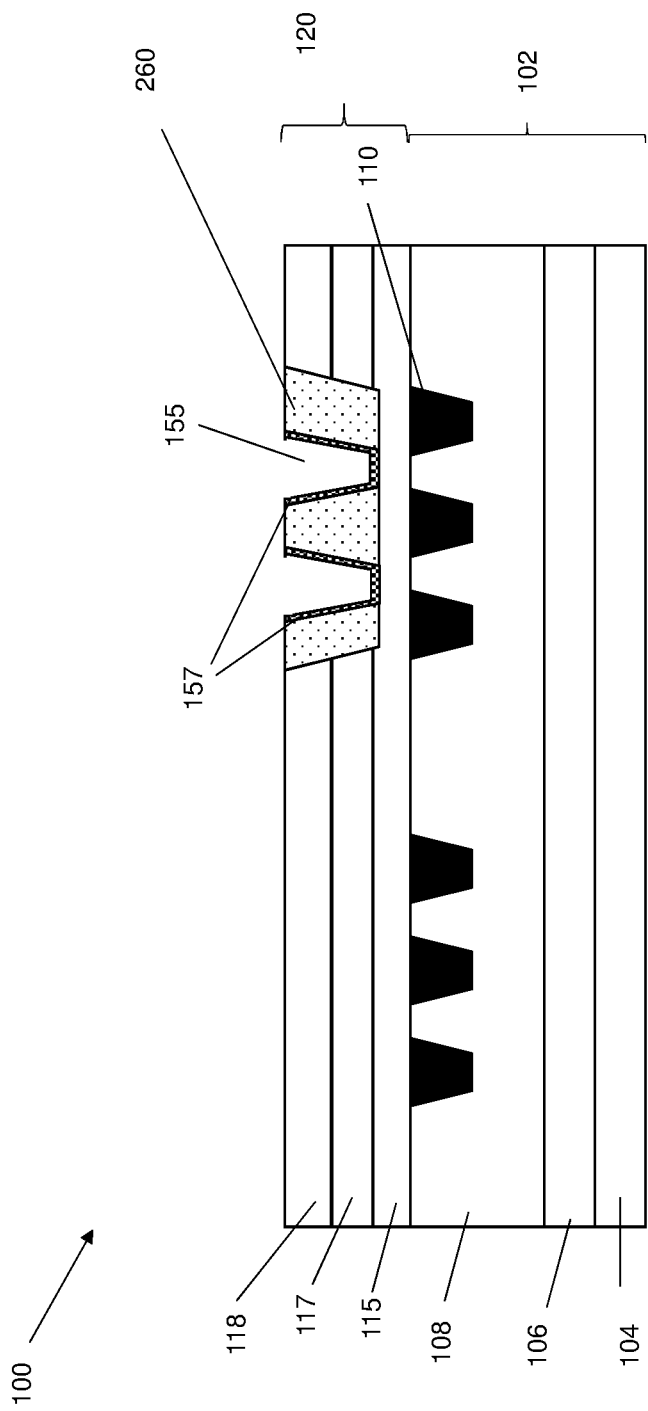
FIG. 6 illustrates a cross-sectional view of an IC structure in an intermediate stage of fabrication after deposition of liners in the trenches in the dielectric layer.

FIG. 6 illustrates deposition of a liner or barrier layer in first and second trenches 155. FIG. 6 illustrates IC structure 100 after deposition of liner 157 in first and second trenches 155 formed as described in FIG. 5. FIG. 6 shows deposition of tantalum liner 157 on surfaces of trenches 155. In embodiments the liner 157 or barrier layer can include tantalum (Ta), tantalum nitride (TaN), titanium (Ti), or titanium nitride (TiN). Thin film deposition of the liner 157 may be accomplished by, for example, chemical vapor deposition (CVD), physical vapor deposition (PVD) or atomic layer deposition (ALD). Liner 157 prevents subsequently deposited metal from migrating to unwanted area of the IC structure 100.

Figure 7:
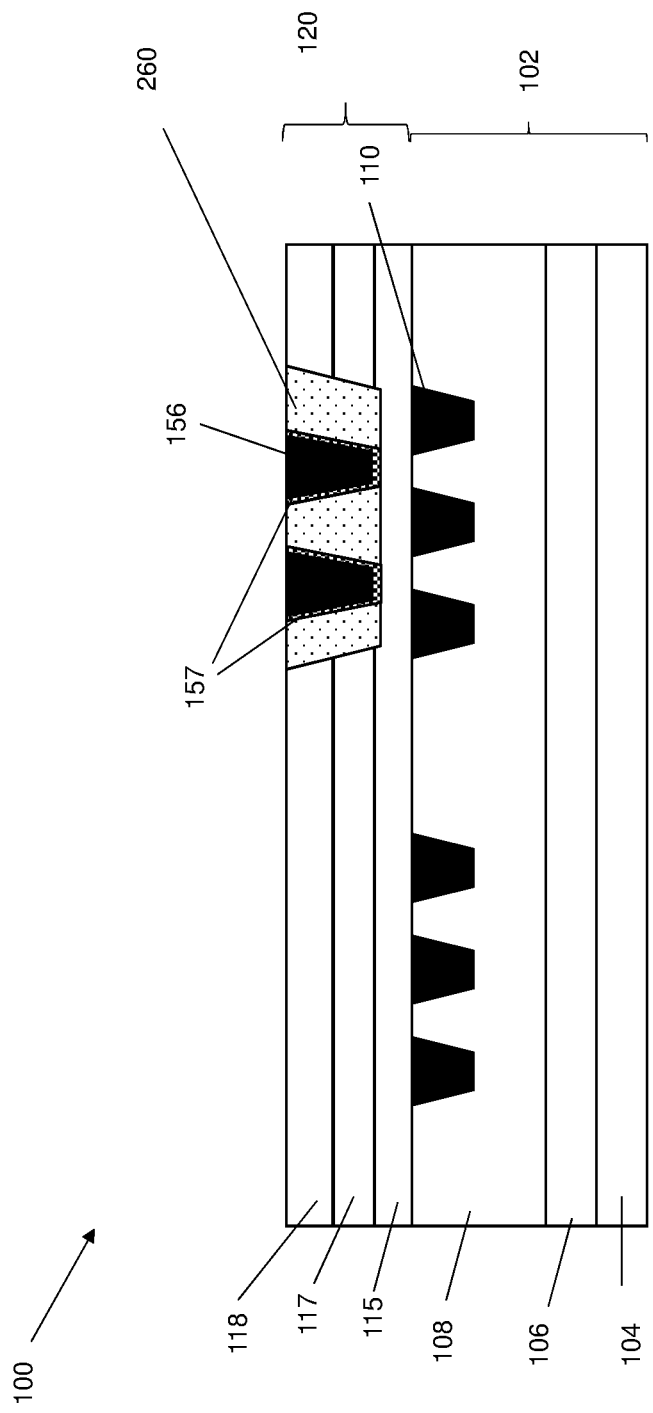
FIG. 7 illustrates a cross-sectional view of an IC structure in an intermediate stage of fabrication after deposition and planarization of metal in the trenches.

FIG. 7 illustrates metal deposition in material formation trenches 155 having liners 157 to form metal formations 156. In FIG. 7, metal formations 156 are shown planarized. Metal formations 156 are separated by high k dielectric 260 and liners 157. In an embodiment the metal deposited in the trenches 155 is copper. Metal formations 156 act as plates to form a capacitor. One of the metal formations 156 would be at a voltage higher than the other metal formation 156. In embodiments other conductors such as aluminum, cobalt, tungsten and ruthenium can be used as alternatives to copper. The deposition of the metals may be by the same processes as used for copper, or another deposition technique appropriate for the metal used.

A deposition process for metal formations may include any now known or later developed technique appropriate for the metal used including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. In embodiments, non-selective sputtering (PVD) and plating, may be used for copper deposition.

A comparison of capacitance density for IC structures manufactured using a prior art process of depositing metal directly in an insulation layer and IC structures manufactured according to the process described in FIGS. 1-7 was conducted. This is shown in Table 1. The increase in capacitance density from the process described herein is from 280 to 840 percent. Using the process disclosed herein in the M3 layer can increase the capacitance by 281.3%. Using the process disclosed herein in layer M1, M2 and M3 can increase the capacitance of the M3 layer by 843.8%.

TABLE 1

| | Capacitance Femtofarads (fF) | Capacitance Density femtofarads per square micrometer (fF/μm$^2$) | Percent change |
|---|---|---|---|
| Process | 7.04 E−17 | 2.49 E+00 | 0 |
| HiK at M3 | 2.68 E−16 | 9.50 E+00 | 281.3 |
| HiK at M1M2M3 | 6.64 E−16 | 2.35 E+00 | 843.8 |

Figure 8:
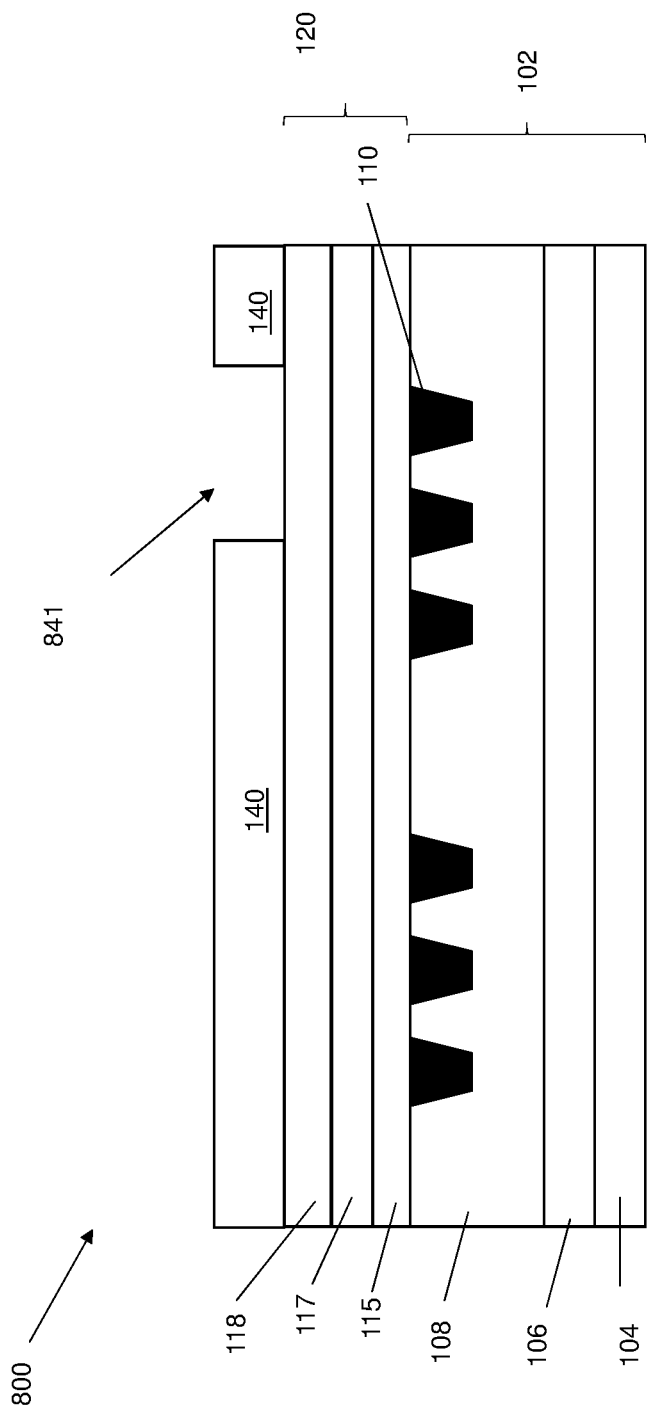
FIG. 8 illustrates another embodiment of a cross-sectional view of an IC structure in an intermediate stage of fabrication after application of a mask.

Referring to FIGS. 8-13, an alternate embodiment of forming a VNCAP is described. In FIG. 8 an IC structure 800, similar to that shown in FIG. 1, includes semiconductor-on-insulator (SOI) substrate 102 which may include base substrate 104, insulator layer 106 and semiconductor-on-insulator (SOI) layer 108 therein. SOI 108 may contain metal formations 110. IC structure 800 includes insulation layer 120 which may further include one or more individual sublayers as described in FIG. 1. In an embodiment, insulation layer 120 includes nitrogen-doped silicon carbide layer 115 such as NBLoK® (NBLoK® is available from Applied Materials, Inc.), silicon dioxide sublayer 117 and silicon nitride sublayer 118. FIG. 8 illustrates IC structure 800 after application of a mask layer 140 which can be over insulation layer 120. Mask layer 140 can include a photoresist mask, such as an extreme ultraviolet (EUV) mask. Mask layer is patterned to include an opening 841.

Figure 9:
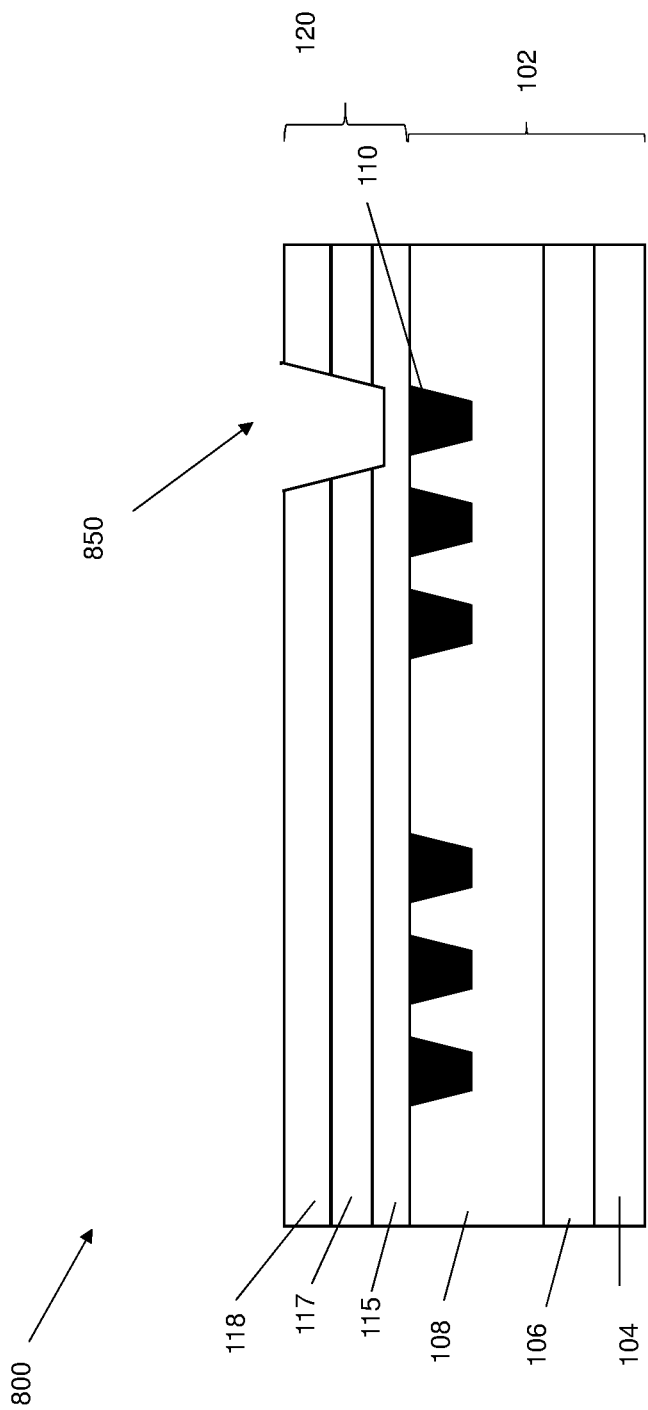
FIG. 9 illustrates another embodiment of a cross-sectional view of an IC structure in an intermediate stage of fabrication after formation of one or more first metal trenches.

FIG. 9 illustrates the IC structure 800 as shown in FIG. 8 after formation of one or more first metal trenches 850 in insulation layer 120. FIG. 9 shows one metal trench 950 but any number can be formed. An etching process as described above, can be used for the formation of trench 850.

Figure 10:
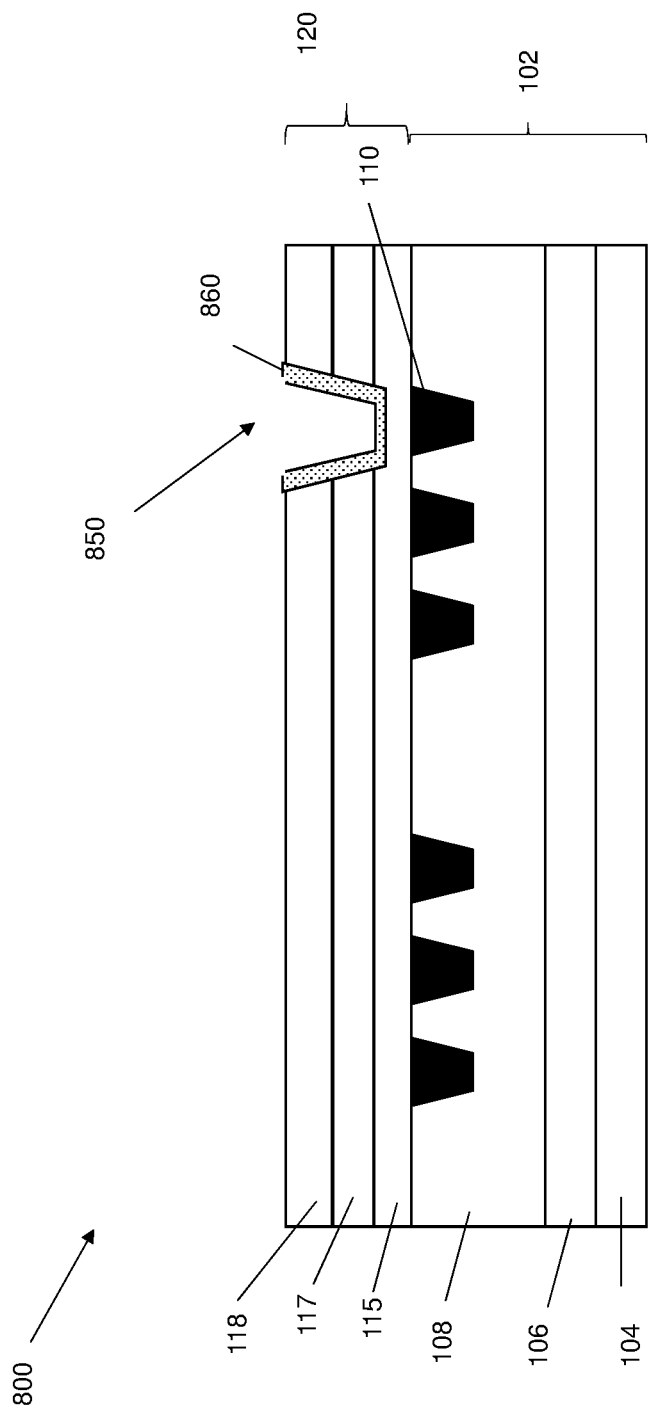
FIG. 10 illustrates another embodiment of a cross-sectional view of an IC structure in an intermediate stage of fabrication after formation of a dielectric liner layer in the one or more first metal trenches.

FIG. 10 illustrates IC structure 800 as shown in FIG. 9 after formation of liner layer 860 in trench 850 and planarization. Liner layer 860 may include a high k dielectric material such as described above. Liner layer 860 may have k values have of between 15 to 7000, or in embodiments from 2000 and 7,000. The deposition of liner layer 860 may be by the processes described above.

Figure 11:
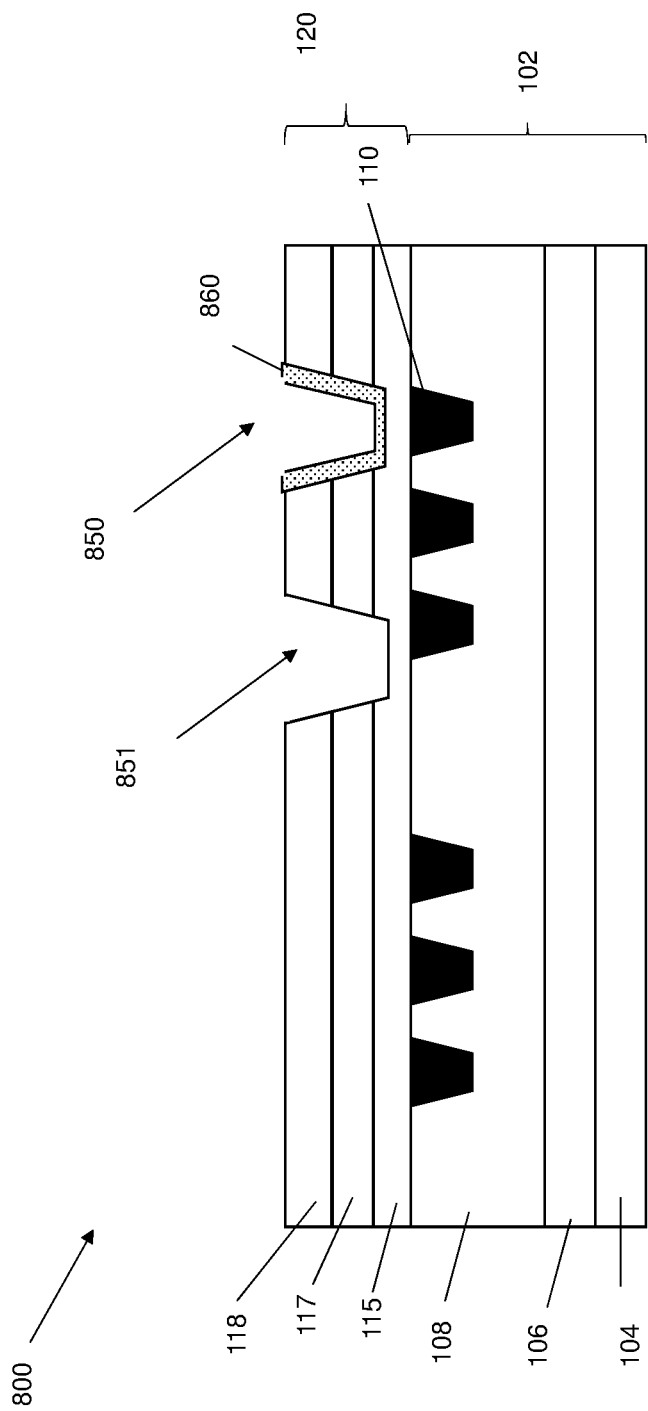
FIG. 11 illustrates another embodiment of a cross-sectional view of an IC structure in an intermediate stage of fabrication after formation of one or more second metal trenches.

FIG. 11 illustrates IC structure 800 after one or more second metal trenches 851 are formed. The formation of one or more second trenches 851 is by the same process as the formation one or more first metal trenches 950.

Figure 12:
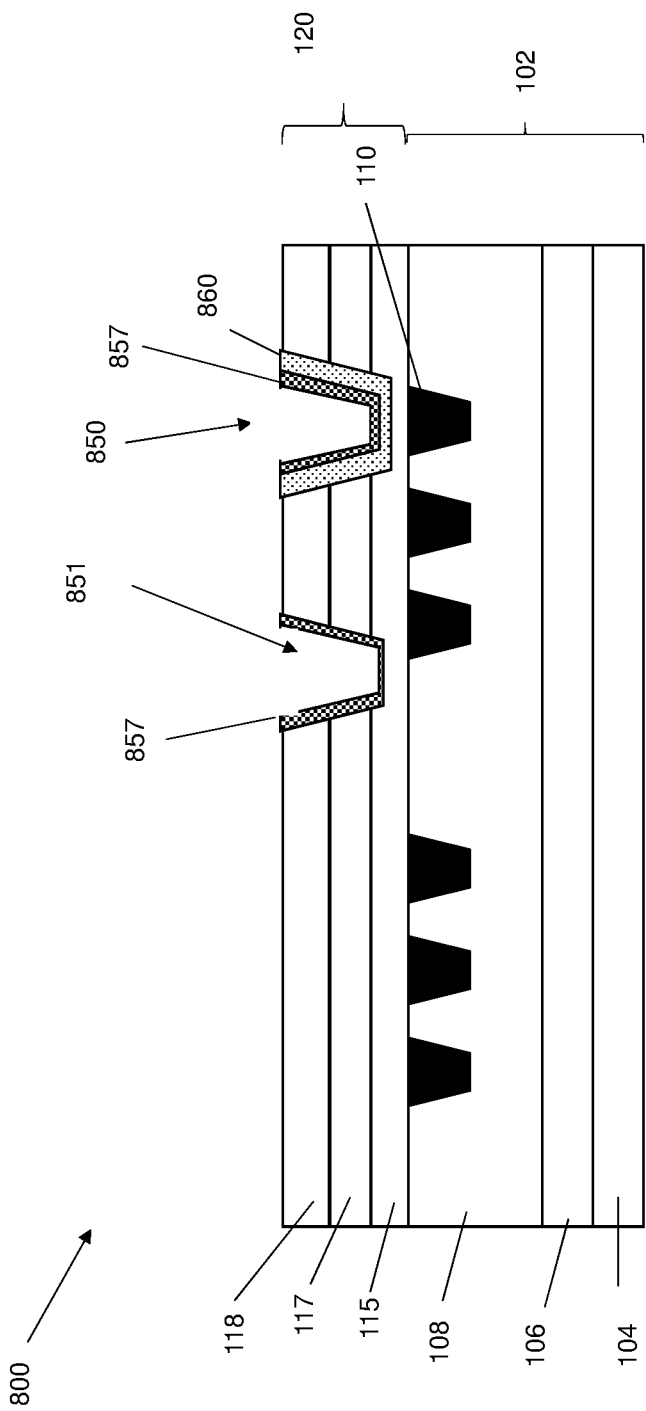
FIG. 12 illustrates another embodiment of a cross-sectional view of an IC structure in an intermediate stage of fabrication after deposition of liners in the trenches.

FIG. 12 illustrates deposition of a liner 857 or barrier layer in the one or more metal trenches 850 having a liner layer 860 of high k dielectric material and the one or more second metal trenches 851. FIG. 12 shows deposition of liner 857 on surfaces of liner layer 860 for one or more first metal trench 850 or on insulation layer 120 for one or more second metal trenches 851. In embodiments the liner 857 or barrier layer can be tantalum (Ta), tantalum nitride (TaN), titanium (Ti), or titanium nitride (TiN). Thin film deposition of the liner 857 may be accomplished by chemical vapor deposition (CVD), physical vapor deposition (PVD) or atomic layer deposition (ALD).

Figure 13:
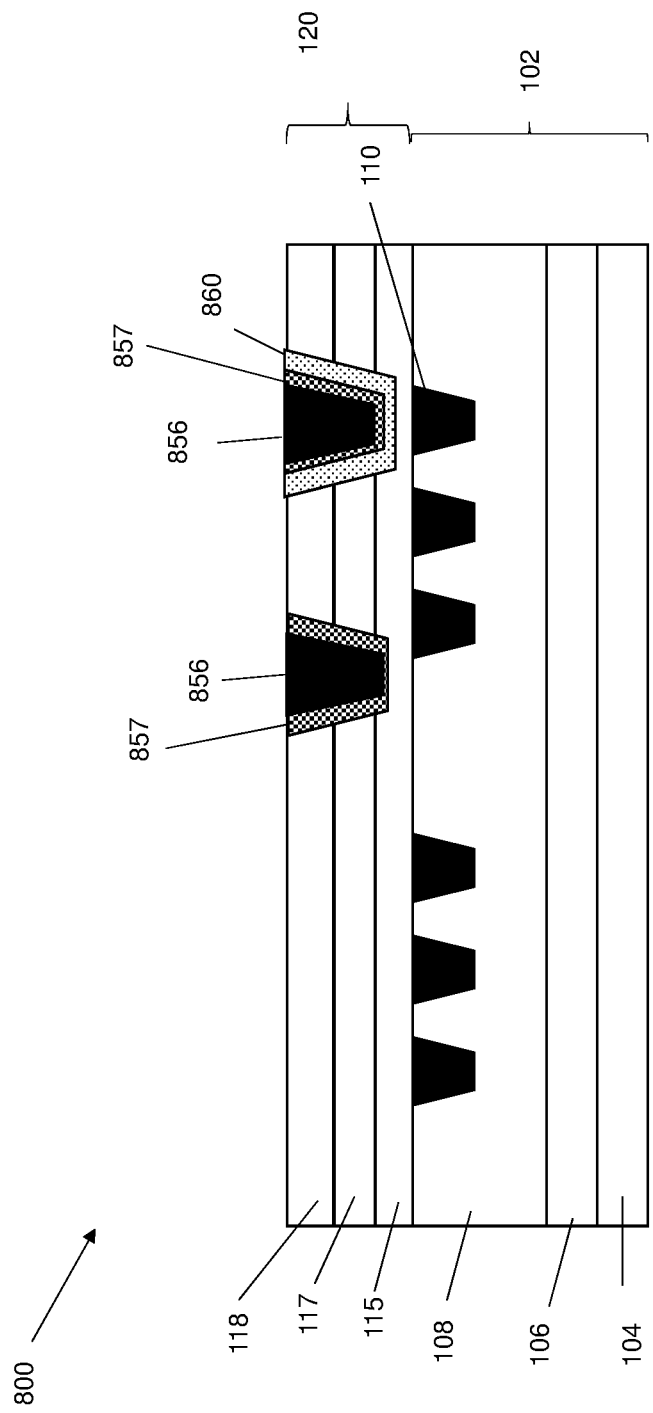
FIG. 13 illustrates another embodiment of a cross-sectional view of an IC structure in an intermediate stage of fabrication after deposition and planarization of metal in the trenches.

FIG. 13 illustrates metal deposition in one or more first trenches 850 and one or more second metal trenches 851 having liners 857 to form metal formations 856. Metal formations 856 are shown after planarizization. Metal formations 856 are separated by high k dielectric 860, liner 857 and insulation layer 120. Metal formations 856 act as plates to form a capacitor. One of the metal formations 856 would be at a voltage higher than the other metal formation 856. In an embodiment the metal deposited in the trenches 850 is copper. In embodiments other conductors such as aluminum, cobalt, tungsten and ruthenium can be used as alternatives to copper. The deposition of the metals is by the same processes as used for copper.

A comparison of capacitance density for IC structures manufactured using a prior art process of depositing metal directly in an insulation layer and IC structures manufactured according to the process described in FIGS. 8-13. This is shown in Table 2. Table 2 shows the thickness in the liner layer of from 0 nm to 8 nm. The increase in capacitance density increase about 4% for each 2 nm thickness in the liner layer 860.

TABLE 2

| HiK liner in FIG. 13 | Capacitance Femtofarads (fF) | Capacitance Density femtofarads per square micrometer (fF/μm$^2$) | Percent change |
|---|---|---|---|
| 0 nm | 7.04 E−17 | 2.49 E+00 | 0 |
| 2 nm | 7.75 E−17 | 2.74 E+00 | 3.6 |
| 4 nm | 8.47 E−17 | 3.00 E+00 | 7.2 |
| 6 nm | 9.36 E−17 | 3.31 E+00 | 11.7 |
| 8 nm | 1.04 E−16 | 3.69 E+00 | 17.0 |

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method comprising:
applying a mask over an insulation layer;
forming using the mask, a dielectric trench in the insulation layer;
depositing a high dielectric constant k (high k) layer in the dielectric trench;
forming a first trench and a second trench in the high k layer, the high k layer disposed between the first trench and the second trench; and
depositing metal in the first trench and the second trench, wherein the metal in the first trench and the metal in the second trench define a capacitor.

2. The method of claim 1, wherein the applying the mask includes using a photoresist or an extreme ultraviolet (EUV) mask.

3. The method of claim 1, wherein the high k layer has a dielectric constant of from 15 to 7000.

4. The method of claim 1, wherein the high k layer has a dielectric constant of from 2000 to 7000.

5. The method of claim 1, further comprising planarizing the high k layer after depositing the high k layer.

6. The method of claim 1, wherein the metal comprises copper, aluminum, tungsten, cobalt, ruthenium, titanium or tantalum.

7. The method of claim 1, further comprising: depositing a liner in the first trench and the second trench prior to depositing the metal in the first trench and the second trench.

8. The method of claim 7, wherein the liner comprises tantalum (Ta), tantalum nitride (TaN), titanium (Ti) or titanium nitride (TiN).

9. A method comprising:
applying a patterned mask over an insulation layer;
forming one or more first metal trenches using the patterned mask in the insulation layer;
depositing a high dielectric constant (high k) dielectric liner layer in the one or more first metal trenches;
applying a second patterned mask over the insulation layer;
forming one or more second metal trenches, wherein the insulation layer is between the one or more first metal trenches and the one or more second metal trenches; and
depositing metal in the one or more first metal trenches and the one or more second metal trenches, wherein the metal in the one or more first metal trenches and the one or more second metal trenches define a vertical natural capacitor (VNCAP).

10. The method of claim 9, wherein the applying the patterned mask includes using a photoresist or EUV mask.

11. The method of claim 9, wherein the metal comprises copper, aluminum, tungsten, cobalt, ruthenium, titanium or tantalum.

12. The method of claim 9, further comprising depositing a liner in the one or more first metal trenches and the second metal trench prior to depositing metal in the one or more first metal trenches and the one or more second metal trenches.

13. The method of claim 12, wherein the liner comprises tantalum (Ta), tantalum nitride (TaN), titanium (Ti) or titanium nitride (TiN).

14. The method of claim 9, wherein the high k dielectric liner layer has a dielectric constant of from 15 to 7000.

15. The method of claim 9, wherein the high k dielectric liner layer has a dielectric constant of from 2000 to 7000.

* * * * *